United States Patent [19]

Meyerson

[11] Patent Number: 5,181,964
[45] Date of Patent: Jan. 26, 1993

[54] SINGLE ENDED ULTRA-HIGH VACUUM CHEMICAL VAPOR DEPOSITION (UHV/CVD) REACTOR

[75] Inventor: Bernard S. Meyerson, Yorktown Height, N.Y.

[73] Assignee: International Business Machines Corporation, Armonk, N.Y.

[21] Appl. No.: 537,180

[22] Filed: Jun. 13, 1990

[51] Int. Cl.$^5$ ............................................. C23C 16/00
[52] U.S. Cl. ................................. 118/719; 118/715; 118/733
[58] Field of Search ..................... 118/715, 719, 733

[56] References Cited

U.S. PATENT DOCUMENTS

| | | | |
|---|---|---|---|
| 3,095,494 | 6/1963 | Denton et al. | 219/201 |
| 3,138,434 | 6/1964 | Diefendorf | 264/81 |
| 3,338,209 | 8/1967 | Bhola | 118/715 |
| 3,751,539 | 8/1973 | Reuschel et al. | 264/81 |
| 3,900,597 | 8/1975 | Chruma et al. | 437/233 |
| 4,237,151 | 12/1980 | Strougin et al. | 427/74 |
| 4,401,689 | 8/1983 | Ban | 427/45.1 |
| 4,636,401 | 1/1987 | Yamazaki et al. | 427/39 |
| 4,640,221 | 2/1987 | Barbee et al. | 118/689 |
| 4,649,859 | 3/1987 | Wanlass | 118/715 |
| 4,703,718 | 11/1987 | Enstrom | 118/715 |
| 4,763,602 | 8/1988 | Madan et al. | 118/719 |
| 4,807,562 | 2/1989 | Sandys | 118/725 |
| 4,920,920 | 5/1990 | Shigeki | 118/715 |
| 4,957,781 | 9/1990 | Kanegae et al. | 118/725 |

FOREIGN PATENT DOCUMENTS 0259759  1/1987  European Pat. Off. .

OTHER PUBLICATIONS

Ohmi, T. et al., "Formation of High Quality Silicon Films by Ultra Clean Technology, Extended Abstracts of the 19th Conference on Solid State Devices and Materials", Tokyo (1987) pp. 239–242.
Yoshiki, S. et al., "Self-Limited Growth in InP Epitaxy by Alternate Gas Supply, Japanese J. of Applied Physics", vol. 27, No. 11 (Nov. 1988), pp. L2189–L2991, FIG. 1; p. L2189, paragraph 2.
T. Itoh et al., *J. Applied Physics*, vol. 39, pp. 2969–2971 (May 1968).
R. C. Henderson and R. F. Helm, *Surface Science*, vol. 30, pp. 310–334 (1972).
W. E. Spear and P. G. LeComber, *Philosophical Magazine*, vol. 33, pp. 935–949 (1976).
M. Ogirima et al. *J. Electrochemical Society*, vol. 124, pp. 903–908 (Jun. 1977).
M. J. P. Duchemin et al., *J. Electrochemical Society*, vol. 125, pp. 637–644 (Apr. 1978).
J. Bloem and L. J. Giling in *Current Topics in Materials Science*, E. Kaldis, ed., vol. 1 (North-Holland Publishing Company 1978) pp. 147–149; 167–207.
S. Suzuki and T. Itoh, *J. Applied Physics*, vol. 54, pp. 1466–1470 (Mar. 1983).
S. K. Ghandi, *VLSI Fabrication Principles*, (John Wiley & Sons 1983) pp. 227–231.
S. Suzuki and T. Itoh, *J. Applied Physics*, vol. 54, pp. 6385–6389 (Nov. 1983).
T. J. Donahue et al., *Applied Physics Letters*, vol. 44, pp. 346–348 (Feb. 1, 1984).
B. S. Meyerson and W. Olbricht, *J. Electrochemical Society*, vol. 131, pp. 2361–2365 (Oct. 1984).
K. F. Roenigk and K. F. Jensen, *J. Electrochemical Society*, vol. 132, pp. 448–454 (Feb. 1985).
T. J. Donahue and R. Reif, *J. Applied Physics*, vol. 57, pp. 2757–2765 (Apr. 15, 1985).
B. S. Meyerson, *Applied Physics Letters*, vol. 48, pp. 797–799 (Mar. 24, 1986).
B. S. Meyerson et al., *J. Electrochemical Society*, vol. 133, pp. 1232–1235 (Jun. 1986).

*Primary Examiner*—Shrive Beck
*Assistant Examiner*—Terry J. Owens
*Attorney, Agent, or Firm*—Pollock, Vande Sande & Priddy

[57] ABSTRACT

An ultra-high vacuum chemical vapor deposition reactor which utilizes only a single large diameter, quartz to metal ultra-high vacuum seal or a water cooled viton seal, which is present at a first end of the reactor tube. The other end of the reactor tube has a substantially reduced diameter, and an ultra-high vacuum seal of correspondingly reduced diameter is used at this end. The pumping apparatus and the load station are both located at the first end of the apparatus to provide a single-ended operation.

3 Claims, 1 Drawing Sheet

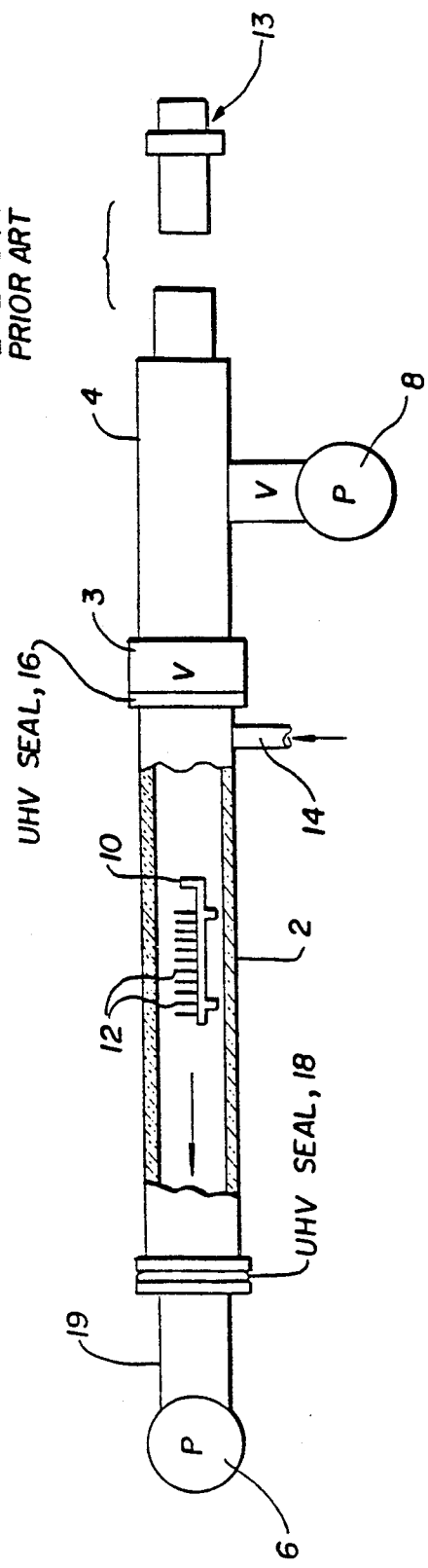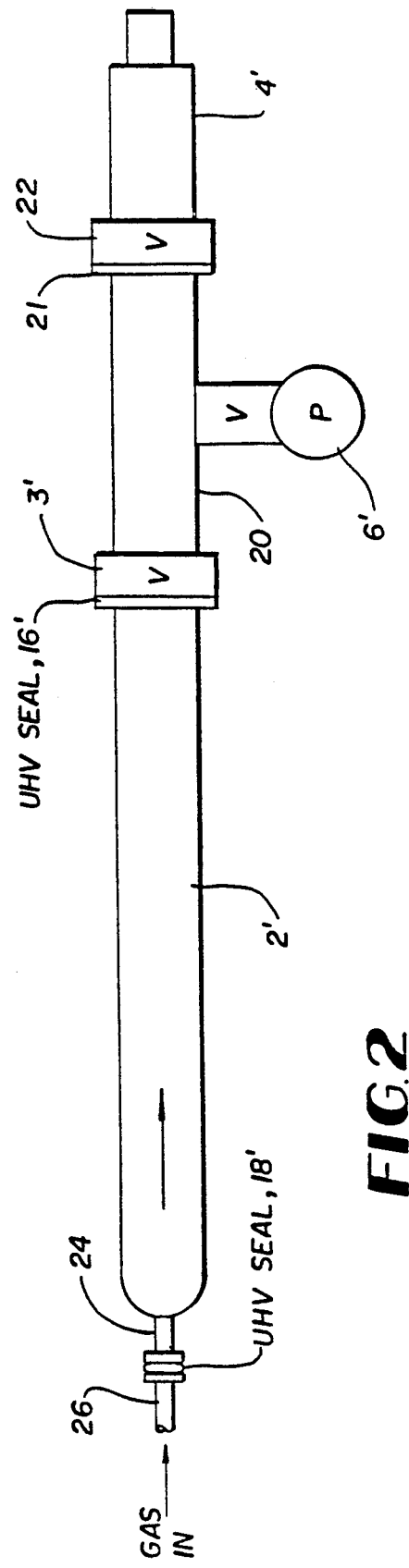

SINGLE ENDED ULTRA-HIGH VACUUM CHEMICAL VAPOR DEPOSITION (UHV/CVD) REACTOR

DESCRIPTION

1. Technical Field

The present invention is directed to an improved reactor for performing an ultra-high vacuum chemical vapor deposition (UHV/CVD) process.

2. Background of the Invention

In co-pending application Ser. No. 906,854, filed Sep. 12, 1986, assigned to the same assignee as the present application, and incorporated herein by reference, an ultra-high vacuum chemical vapor deposition (UHV/CVD) process is described. This process achieves epitaxial deposition of silicon layers at lower temperatures and pressures then were previously used. The use of lower temperatures is directed at the problem of dopant diffusion, wherein dopants from the substrate on which the epitaxial layer is deposited move into the epitaxial layer and vice versa, which movement tends to increase with temperature. High quality epitaxial layers having relatively low defect densities are provided by the process of the prior invention.

Some difficulties which have been associated with the practice of this process have been caused by the fact that the prior art reactor has required the use of two relatively large ultra-high vacuum (UHV) seals, which are disposed at respective ends of the quartz reactor tube. At these ends, the quartz tube is joined to metal components, and it therefore has been necessary to use either graded quartz to metal seals or seals made of VITON material. Both such options present problems, since graded quartz to metal seals of the relatively large circumference required (approximately 30") are extraordinarily expensive as well as being somewhat unreliable, while VITON seals of circumferences this large tend to significantly degrade the ultra-high vacuum which is necessary to carry out the process, as the leak rate of such seals is a function of their circumference.

Additionally, the use of inflexible large circumference seals at opposite ends of the reactor tube requires that the respective ends of the apparatus be perfectly aligned, which is difficult to accomplish in practice. Finally, the use of such seals makes it difficult to maintain the apparatus, as replacement of the reactor tube requires the removal of all pumping and valving hardware located behind it, which procedure takes approximately three hours.

SUMMARY OF THE INVENTION

It is thus an object of the present invention to provide a UHV/CVD reactor which uses a more inexpensive seal arrangement than has heretofore been used.

It is a further object of the invention to provide a UHV/CVD reactor which uses a more reliable seal arrangement than has heretofore been used.

It is still a further object of the invention to provide a UHV/CVD reactor wherein the respective ends do not have to be perfectly aligned.

It is still a further object of the invention to provide a UHV/CVD reactor in which the reactor tube can be withdrawn and/or replaced in a small fraction of the time that was previously required.

In accordance with the invention the above objects are accomplished by providing a UHV/CVD reactor wherein the pump hardware and load station are at the same end of the apparatus. An ultra-high vacuum seal similar to the type which was previously used is required at this end, but the other end of the reactor tube, which is the gas inlet end, has an opening of substantially reduced diameter, so that the seal at this end will have a much smaller circumference, and will not present the problems which are associated with the larger circumference seals. A metal tube communicates with the reactor tube at the pump/load station end, and the pump is connected to this tube by a tee section for drawing gas which is inputted at the gas inlet end through the reactor tube.

The use of a small diameter seal at the gas inlet end, which can be a graded seal, Viton rubber seal, or other type, substantially reduces the cost of the apparatus. Additionally, since such seals of small circumference do not have a substantial leak rate, the vacuum in the reactor tube is not degraded. Since there is only one large diameter, inflexible seal in the apparatus of the invention instead of two, as in the prior apparatus, the ends of the reactor do not have to be perfectly aligned. Finally, since all UHV pumps and associated connections are eliminated at one end of the apparatus, the process tube may be withdrawn at that end by only disconnecting a single, small joint. This operation is a great savings over the procedure associated with the prior apparatus, which required the removal of all pumping and valving hardware located behind the process tube, so that the time which is required to replace the process tube drops from roughly three hours to ten minutes. Additionally, the new replacement procedure is a more reliable operation by virtue of having to break fewer large diameter UHV seals.

BRIEF DESCRIPTION OF THE DRAWINGS

The invention will be better appreciated by referring to the accompanying drawings, wherein:

FIG. 1 is a schematic representation of the prior art apparatus.

FIG. 2 is a schematic representation of the apparatus of the present invention.

DESCRIPTION OF THE PREFERRED EMBODIMENT

Referring to FIG. 1, a UHV/CVD reactor generally as described in above-mentioned U.S. appl. Ser. No. 906,854 is shown.

As mentioned above, this reactor is used to perform an epitaxial deposition process at lower temperatures and pressures than had previously been used. Thus, the operating deposition temperature of the process performed by the reactor shown in FIG. 1 is less than about 800° C. while the operating total pressure is generally less than about 200 mTorr. Additionally, the apparatus is operated such that the partial pressures of all contaminants in the process tube are maintained less than $10^{-8}$ Torr at all times, that is both prior to and during deposition onto the substrates.

Referring to FIG. 1, the apparatus is comprised of hot wall UHV reactor chamber 2 which is made of quartz, and load chamber 4, which is made of a metal such as stainless steel. The reactor chamber and load chamber are separated by main valve 3, which serves as the isolation valve between the chambers. Pumping means 6 and 8 are also provided for the reactor and load chambers respectively, and as initial process steps, the load chamber is pumped down to a pressure of $10^{-7}$ Torr, while the reactor chamber is pumped down to $10^{-8}$ Torr.

After the performance of other process steps, the quartz substrate boat 10, which contains wafers 12, is transferred from the load chamber to the reactor by transfer means 13. Silicon containing gas is admitted through gas inlet tube 14 and is pumped through the reactor in the direction shown. Epitaxial deposition onto all of the wafers then occurs, and the pumping system 6 is maintained at all times, the operating pressure within the chamber 2 being determined by the amount and flow of the gas species in the chamber. The thickness of the epitaxial layer produced depends upon the growth rate and the time of deposition, which is generally controlled by the temperature in the deposition reactor, or to a lesser degree by the reactant pressure.

Seal 16, at the right end of the apparatus in the Figure, seals the quartz reactor tube and the metal isolation valve 3, while seal 18, at the left end of the apparatus seals the quartz reactor tube and the metal pump tubing 19. Since an ultra-high vacuum background pressure of contaminants is maintained in reactor tube 2 at all times during the process, seals 16 and 18 must be of the UHV type. In general, two types of UHV seals are available, but both suffer from disadvantages at the relatively large diameter required, which is about ten inches for the apparatus shown in FIG. 1.

The first type of seal is of the "graded" type, wherein a graded borosilicate glass member connects to the quartz at one side and to the metal on the other. This type of seal is exceedingly expensive in the required diameter, and additionally is somewhat unreliable. Further, it is inflexible, and if one such seal is used at each end of the reactor tube, great difficulties are encountered in attaining the perfect alignment which is then necessary in assembling the apparatus.

The second type of seal which may be used is of the VITON O-ring type, as depicted by seal 18 in FIG. 1. In such a seal, the leak rate is dependent on the circumference, and at the required circumference of more than about 30 inches, it is found that the vacuum becomes significantly degraded.

Additionally, with both types of seals, when it is necessary to withdraw the reactor tube, all of the pumping and valving hardware which is represented by pumping means 6 in FIG. 1, must be removed, which is a major job taking about three hours. It is noted that in terms of actual hardware, pumping means 6 may be comprised of two pumps and several valves.

The foregoing problems are obviated by the unique structure of the present invention, and an illustrative embodiment thereof is shown in FIG. 2, wherein like components are identified with the same numerals as in FIG. 1.

Referring to FIG. 2, it is seen that the geometry of the system is "single ended", in that both the reactor chamber pump and the load station are located at the same end of the system. Thus, it is seen that reactor chamber 2' and load chamber 4' both communicate with conduit 20, which typically is made of stainless steel. An optional valve 3' separates the reactor chamber 2' from conduit 20, while another valve 22 is intermediate the conduit 20 and the load chamber 4'. Additionally, there can be a quartz to metal seal or a water cooled VITON seal 16' between the reactor chamber 2' and the valve 3', while there is a metal to metal seal 21 between the conduit 20 and the valve 22.

As can be seen by referring to the figure, the reactor chamber 2' has a substantially reduced diameter at the left end in the figure, and is terminated in a substantially reduced diameter cylindrical portion 24. This portion is joined to a metal gas inlet tube 26 of similarly small diameter by a quartz to metal seal 18'. For example, gas inlet tube 26 may be made of a section of flexible conduit.

Thus, in the operation of the reactor, gas is fed to gas inlet tube 26, and is pumped through the reactor tube by pump means 6', while wafers on which substances in the gas are to be deposited are fed to the reactor tube from load chamber 4' through conduit 20. Pump means 6' may include a turbo pump, mechanical pump, and roots blower.

Thus, it is seen that in the arrangement of FIG. 2, only a single large diameter quartz to metal seal 16' or water cooled VITON seal is required, while the other quartz to metal seal 18' is of much smaller diameter.

In this regard, while the reactor tube 2' is about ten inches in diameter through most of its length, at end portion 24, the diameter can be reduced to about ½ inch. Thus, the ratio of the circumference of seal 18' in FIG. 1 to the circumference of seal 18' in FIG. 2 is about 20:1. In this case, seal 18' can be any of a variety of different types, since as previously explained the problems associated with large circumference quartz to metal seals are not present with seals of smaller circumference. Thus, for example, the seal 18' can be a small seal of the graded type or of VITON, or of the MINI-CONFLAT type.

It can thus be appreciated that the reactor of the present invention is considerably less expensive to build than the prior art reactor, and has less of a vacuum leakage problem. Further, it is no longer a requirement that the two ends of the system be perfectly aligned. Thus, the reactor tube can be aligned with its mate at the load end of the system and a flexible steel conduit can be used for the gas inlet tube 26. Finally, withdrawing the process tube is a simple operation which involves disconnecting the seal 18', rather than removal of all of the pumping and valving hardware behind the process tube as in the prior art system, and the replacement time drops from about three hours to ten minutes. The replacement process is a far more reliable operation by virtue of having to replace fewer UHV seals.

A representative deposition process utilizing the reactor of the invention would be performed as follows:

1. The pumping apparatus 6' is employed to create a base total pressure less than about $10^{-8}$ Torr in UHV section 2'. During this time, the valve 22 is closed, thus isolating the load station, while valve 3' is open.

2. The quartz substrate boat is placed into the load chamber 4', and is baked at approximately 100° C. while the load chamber is being pumped to a pressure of approximately $10^{-7}$ Torr.

3. Hydrogen gas is injected into section 2' via inlet 26, and the temperature therein is set at about 550° C. The introduction of hydrogen into this section raises the total pressure to about 250 mTorr.

4. Valve 22 is then opened, and the quartz substrate carrier is transferred from load chamber 4' to the reactor chamber, and the valve 22 is then closed. The substrates are then baked for about 5 minutes in a hydrogen atmosphere, the baking temperature being whatever temperature is to be the deposition temperature. This will generally be from about 450° C. to about 800° C.

5. The hydrogen flow is stopped and the silicon gas source is activated to introduce a gaseous species containing silicon into the deposition chamber 2'. If the epitaxial silicon layers are to be doped in-situ, a dopant-containing gas species can also be introduced via inlet 26.

6. Epitaxial deposition onto all of the substrates then occurs. The pumping system 6' is maintained at all times, the operating pressure within deposition chamber 2' being determined by the amount and flow of the gas species in the chamber. The thickness of the epitaxial layers so produced depends upon the growth rae and the time of deposition, which are in turn generally controlled by the temperature in the deposition reactor, or to a lesser degree by the reactant pressure.

There thus has been provided a simple, inexpensive, and effective arrangement for performing UHV/CVD processes. Further, the arrangement of the invention in which flow is inverted in unique to UHV/CVD systems. Thus, in prior epitaxy systems, where flow is laminar, system geometries cannot be inverted while still retaining function. Further, particles entrained in the laminar flowing gas would result in ruining the sealing surfaces of the valve separating the load chamber from the reactor chamber. This is obviated in UHV/CVD processes wherein operations under laminar flow is bypassed such that particulates are not carried in the gas stream.

It should be appreciated that while the invention has been disclosed in connection with a specific embodiment for purposes of illustration, it is to be limited only by the claims which are appended hereto and equivalents.

Having thus described my invention, what I claim as new and desire to secure by Letters Patent is:

1. An ultra-high vacuum chemical vapor deposition reactor, comprising, a hollow reactor tube made of quartz having an opening of a given diameter at one end and an opening having a diameter which is substantially smaller than said given diameter at the other end, which is the gas inlet end, a first metal tube in communication with said reactor tube at said one end, there being a first ultra-high vacuum seal intermediate said reactor tube and said first metal tube, said seal being of a given circumference, corresponding to said given diameter of said reactor tube at said one end, a metal gas inlet tube extending from said reactor tube at said gas inlet end, there being a second ultra-high vacuum seal between said reactor tube and the metal gas inlet tube, which second seal has a circumference which corresponds to the diameter of the reactor tube at said gas inlet end, said circumference of said second seal being substantially smaller than said given circumference of said first seal, a load chamber in communication with said first metal tube for supplying objects on which a substance is to be deposited, a valve means being disposed between said first metal tube and said load chamber, and ultra-high vacuum pumping means located only downstream of said reactor tube and communicating with said first metal tube between said reactor tube and said load chamber for pumping gas which enters through said gas inlet tube through said reactor tube.

2. The reactor of claim 1 wherein there is a further valve means between said reactor tube and said first metal tube, and wherein said first seal is between said reactor tube and said valve means.

3. The reactor of claim 2 wherein said pumping means is connected to said metal tube by a tee section.

* * * * *